(12) United States Patent
Yeh et al.

(10) Patent No.: US 8,976,828 B1
(45) Date of Patent: Mar. 10, 2015

(54) DRIVING CIRCUIT OF A LASER DIODE AND DRIVING METHOD OF A LASER DIODE

(71) Applicants: Etron Technology, Inc., Hsinchu (TW); TM Technology Inc., Hsinchu (TW)

(72) Inventors: Ren-Bang Yeh, New Taipei (TW); Jiann-Chyi Sam Shieh, San Jose, CA (US); Chih-Yang Wang, Kaohsiung (TW)

(73) Assignees: Etron Technology, Inc., Hsinchu (TW); TM Technology Inc., Science-Based Industrial Park, Hsinchu (TW)

( * ) Notice: Subject to any disclaimer, the term of this patent is extended or adjusted under 35 U.S.C. 154(b) by 0 days.

(21) Appl. No.: 14/477,893

(22) Filed: Sep. 5, 2014

Related U.S. Application Data

(60) Provisional application No. 61/874,369, filed on Sep. 6, 2013.

(51) Int. Cl.
*H01S 3/00* (2006.01)
*H01S 5/06* (2006.01)

(52) U.S. Cl.
CPC .................................. *H01S 5/06* (2013.01)
USPC ........................................... 372/38.02

(58) Field of Classification Search
CPC ................ H01S 5/30; H01S 3/00; H01S 5/06
USPC ............................................. 372/38
See application file for complete search history.

(56) References Cited

U.S. PATENT DOCUMENTS

| 7,171,127 B2 * | 1/2007 | Matsuo ................ 398/195 |
| 2008/0159349 A1 * | 7/2008 | Kaji et al. ............ 372/38.02 |

* cited by examiner

*Primary Examiner* — Tuan Nguyen
(74) *Attorney, Agent, or Firm* — Winston Hsu; Scott Margo

(57) ABSTRACT

A driving method of a laser diode includes setting a bias current, a modulation current, a first target corresponding to a predetermined average power, and a second target corresponding to a predetermined average modulation power; executing a first adjusting current step group; generating a temporary modulation current according to the modulation current; executing a second adjusting current step group; and executing the first adjusting current step group again.

21 Claims, 9 Drawing Sheets

DRIVING CIRCUIT OF A LASER DIODE AND DRIVING METHOD OF A LASER DIODE

CROSS REFERENCE TO RELATED APPLICATIONS

This application claims the benefit of U.S. Provisional Application No. 61/874,369, filed on Sep. 6, 2013 and entitled "Dual Closed Loop," the contents of which are incorporated herein by reference.

BACKGROUND OF THE INVENTION

1. Field of the Invention

The present invention relates to a driving circuit of a laser diode and a driving method of a laser diode, and particularly to a driving circuit of a laser diode and a driving method of a laser diode that have dual feedback loop for adjusting current to make the laser diode maintain a fixed extinction ratio under different operation temperatures.

2. Description of the Prior Art

Please refer to FIG. 1. FIG. 1 is a diagram illustrating relationships between output powers, input currents, and operation temperatures of a laser diode. As shown in FIG. 1, if the operation temperature of the laser diode is 25° C., when the input current is a bias current IBIAS1, the bias current IBIAS1 can make the laser diode output an output power P0, and when the input current is a sum of the bias current IBIAS1 and a modulation current IMOD1, the sum of the bias current IBIAS1 and the modulation current IMOD1 can make the laser diode output an output power P1, wherein the output power P1 corresponds to a logic value ⌈1⌋ of a light signal and the output power P0 corresponds to a logic value ⌈0⌋ of the light signal, and an average value of the output power P0 and the output power P1 is an average power PAVE. If the operation temperature of the laser diode is 85° C., when the input current is a bias current IBIAS2, the bias current IBIAS2 can make the laser diode output the output power P0, and when the input current is a sum of the bias current IBIAS2 and a modulation current IMOD2, the sum of the bias current IBIAS2 and the modulation current IMOD2 can make the laser diode output the output power P1.

As shown in FIG. 1, because a slope of a characteristic curve of the laser diode under the operation temperature (25° C.) is greater than the slope of the characteristic curve of the laser diode under the operation temperature (85° C.), the bias current IBIAS2 needs to be greater than the bias current IBIAS1 and the modulation current IMOD2 also needs to be greater than the modulation current IMOD1 to maintain an extinction ratio (P1/P0) of the laser diode. For solving the above mentioned problem, the prior art adjusts the bias currents and the modulation currents of the laser diode under different operation temperatures according to a lookup table, wherein the lookup table records relationships between the operation temperatures, the bias currents and the modulation currents. Thus, the prior art may need a large number of memories to store the lookup table, resulting in cost being increased. In addition, another prior art provides a single loop automatic power control to fix an average output power of the laser diode. Although the single loop automatic power control can fix the average output power of the laser diode, the single loop automatic power control cannot make the extinction ratio of the laser diode unchangeable. Therefore, the above mentioned prior arts are not good choices for the laser diode when the laser diode operates under different temperature.

SUMMARY OF THE INVENTION

An embodiment of the present invention provides a driving method of a laser diode. The driving method includes setting a bias current, a modulation current, a first target corresponding to a predetermined average power, and a second target corresponding to a predetermined average modulation power; executing a first adjusting current step group, wherein the first adjusting current step group includes driving a laser diode according to the bias current and the modulation current; generating a first monitor value corresponding to an average power of the laser diode according to light emitted by the laser diode; comparing the first monitor value with the first target; and adjusting the bias current or maintaining the bias current according to a first comparison result; generating a temporary modulation current according to the modulation current; executing a second adjusting current step group, wherein the second adjusting current step group includes driving the laser diode according to the bias current and the temporary modulation current; generating a second monitor value corresponding to an average modulation power of the laser diode according to the light emitted by the laser diode; comparing the second monitor value with the second target; and adjusting the modulation current or maintaining the modulation current according to a second comparison result; and executing the first adjusting current step group again.

Another embodiment of the present invention provides a driving method of a laser diode. The driving method includes setting a bias current, a modulation current, a first target corresponding to a predetermined average power, and a second target corresponding to a predetermined average modulation power; repeatedly executing a first adjusting current step group a first predetermined times, wherein the first adjusting current step group includes driving a laser diode according to the bias current and the modulation current; generating a first monitor value corresponding to an average power of the laser diode according to light emitted by the laser diode; comparing the first monitor value with the first target; and adjusting the bias current or maintaining the bias current according to a first comparison result; generating a temporary modulation current according to the modulation current; repeatedly executing a second adjusting current step group a second predetermined times, wherein the second adjusting current step group includes driving the laser diode according to the bias current and the temporary modulation current; generating a second monitor value corresponding to an average modulation power of the laser diode according to the light emitted by the laser diode; comparing the second monitor value with the second target; and adjusting the modulation current or maintaining the modulation current according to a second comparison result; and executing the first adjusting current step group again the first predetermined times.

Another embodiment of the present invention provides a driving circuit of a laser diode. The driving circuit includes a driving unit, a power generation unit, a comparison unit, a first current generation module, and a second current generation module. The driving unit is used for driving a laser diode according to a bias current, a modulation current, and a first driving signal, or according to the bias current, a temporary modulation current, and a second driving signal, or according to the bias current and the modulation current, or according to the bias current and the temporary modulation current. The monitor unit is used for generating a first monitor value corresponding to an average power of the laser diode and a second monitor value corresponding to an average modulation power of the laser diode according to light emitted by the laser diode. The comparison unit is used for comparing the first monitor value with a first target corresponding to a predetermined average power to generate a first comparison result, and comparing the second monitor value with a second target corresponding to a predetermined average modulation power to generate a second comparison result. The first current generation module is used for executing a first corresponding operation on the bias current according to the first comparison result. The second current generation module is used for generating the temporary modulation current according to the modulation current, and executing a second corresponding operation on the modulation current according to the second comparison result.

The present invention provides a driving circuit of a laser diode and a driving method of a laser diode. The driving circuit and the driving method utilize a first current generation module of the driving circuit and an first target to adjust a bias current driving the laser diode, and utilize a second current generation module of the driving circuit and a second target to adjust a modulation current driving the laser diode. Therefore, compared to the prior art, the present invention has advantages as follows: first, because the present invention has a feedback loop corresponding to the first current generation module adjusting the bias current and a feedback loop corresponding to the second current generation module adjusting the modulation current, the present invention does not need an additional memory; and second, because the present invention has the feedback loop corresponding to the first current generation module adjusting the bias current and the feedback loop corresponding to the second current generation module adjusting the modulation current, the present invention can make the laser diode maintain a fixed extinction ratio under different operation temperatures.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
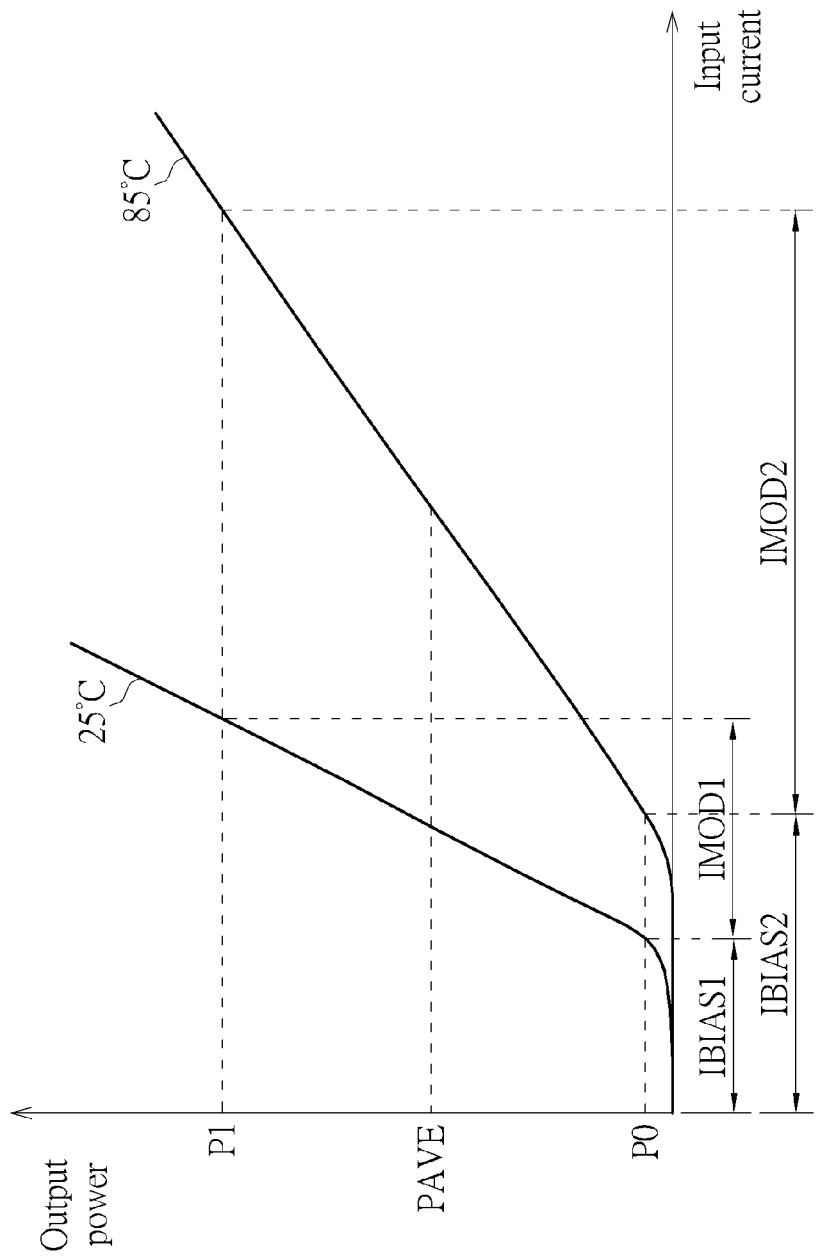
FIG. 1 is a diagram illustrating relationships between output powers, input currents, and operation temperatures of a laser diode.
Figure 2:
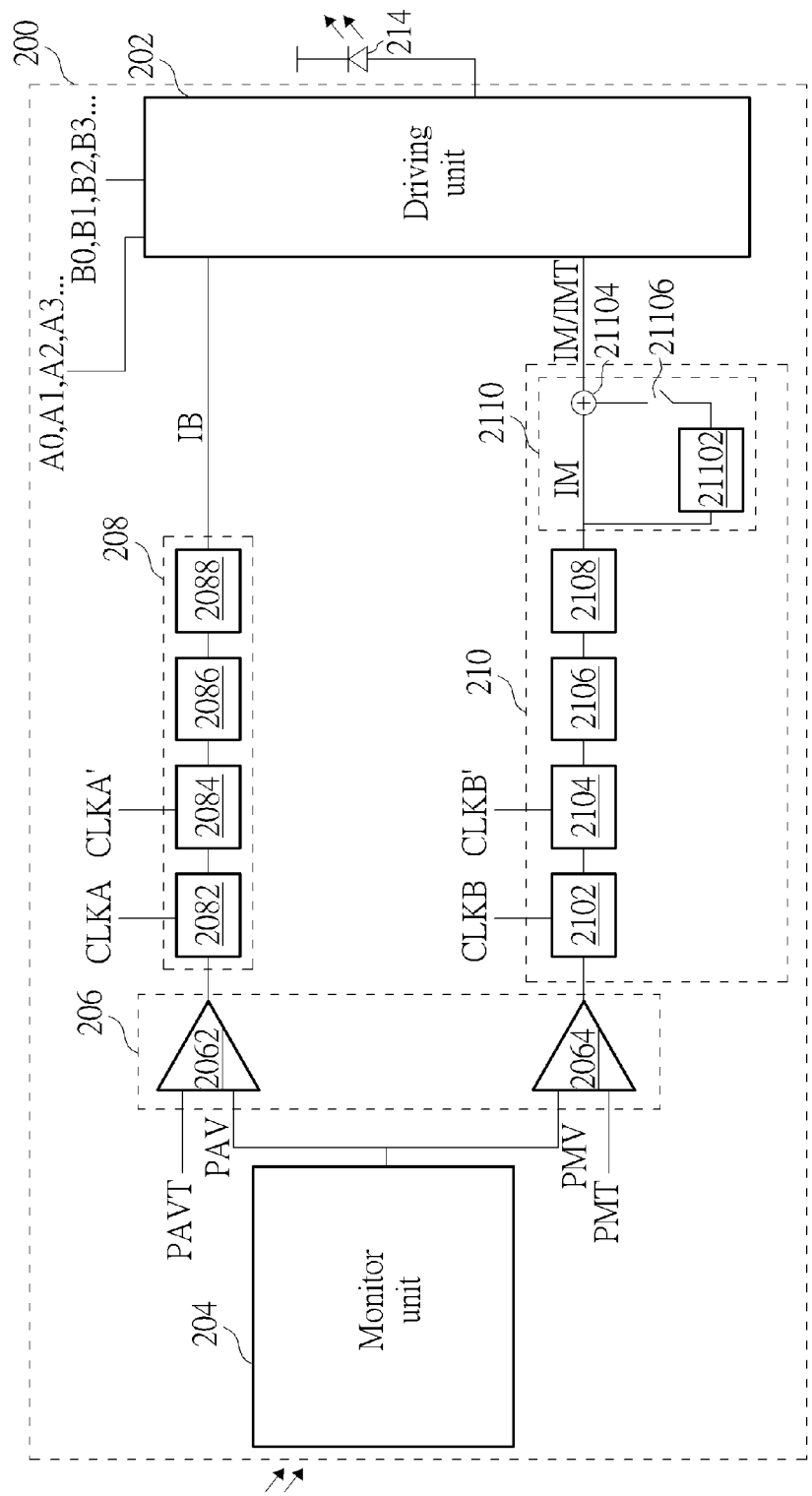
FIG. 2 is a diagram illustrating a driving circuit of a laser diode according to a first embodiment.

Please refer to FIG. 2. FIG. 2 is a diagram illustrating a driving circuit 200 of a laser diode according to a first embodiment. As shown in FIG. 2, the driving circuit 200 includes a driving unit 202, a monitor unit 204, a comparison unit 206, a first current generation module 208, and a second current generation module 210. As shown in FIG. 2, the comparison unit 206 is coupled to the monitor unit 204, wherein the comparison unit 206 includes a first comparator 2062 and a second comparator 2064. The first current generation module 208 is coupled between the first comparator 2062 and the driving unit 202, wherein the first current generation module 208 includes a first flip-flop 2082, a first digital filter 2084, a first counter 2086, and a first digital-to-analog converter 2088. The second current generation module 210 is coupled between the second comparator 2064 and the driving unit 202, wherein the second current generation module 210 includes a second flip-flop 2102, a second digital filter 2104, a second counter 2106, a second digital-to-analog converter 2108, and a temporary modulation current generator 2110, and the temporary modulation current generator 2110 includes a multiplier 21102, an adder 21104, and a switch 21106.

Figure 3A:
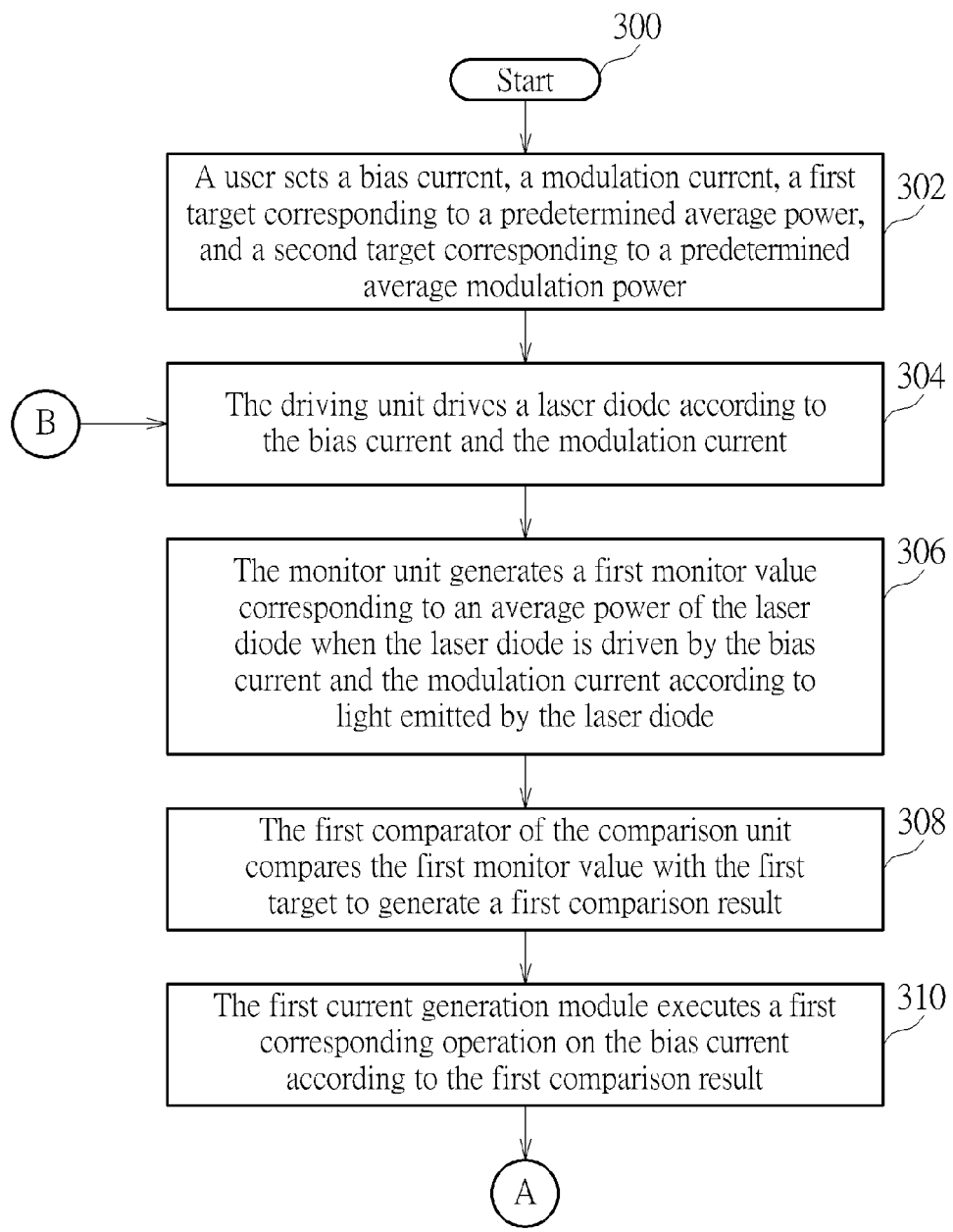
FIG. 3A and FIG. 3B are flowcharts illustrating a driving method of a laser diode according to a second embodiment.
Figure 3B:
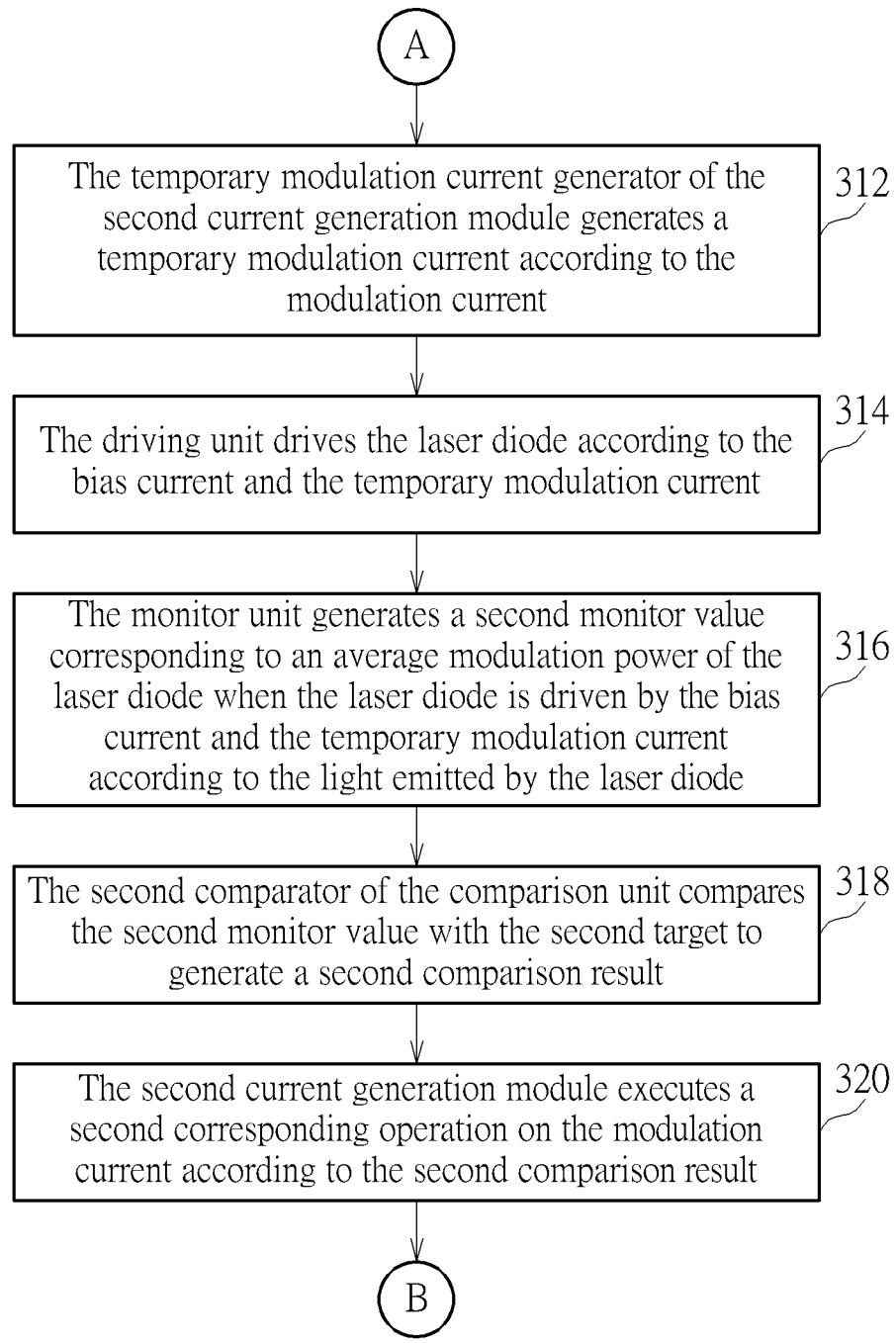
Figure 4:
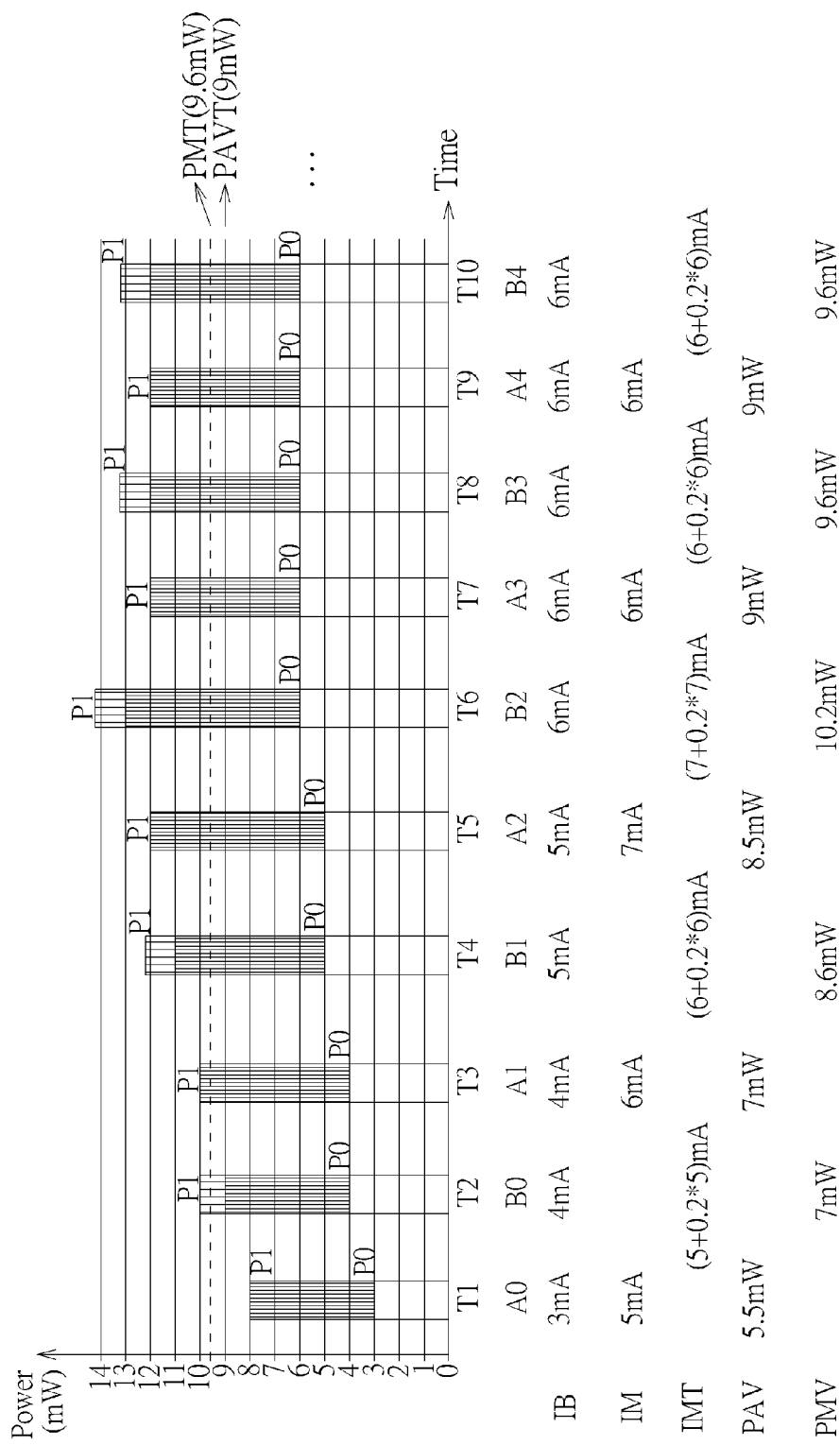
FIG. 4 is a diagram illustrating the bias current, the modulation current, the temporary modulation current, a first monitor value, a second monitor value, and corresponding output powers.

Please refer to FIGS. 2, 3A, 3B, 4. FIG. 3A and FIG. 3B are flowcharts illustrating a driving method of a laser diode according to a second embodiment, and FIG. 4 is a diagram illustrating the bias current, the modulation current, the temporary modulation current, a first monitor value, a second monitor value, and output powers. The method in FIG. 3A and FIG. 3B is illustrated using the driving circuit 200 in FIG. 2. Detailed steps are as follows:

Step 300: Start.

Step 302: A user sets a bias current IB, a modulation current IM, a first target PAVT corresponding to a predetermined average power, and a second target PMT corresponding to a predetermined average modulation power.

Step 304: The driving unit 202 drives a laser diode 214 according to the bias current IB and the modulation current IM.

Step 306: The monitor unit 204 generates a first monitor value PAV corresponding to an average power of the laser diode 214 when the laser diode 214 is driven by the bias current IB and the modulation current IM according to light emitted by the laser diode 214.

Step 308: The first comparator 2062 of the comparison unit 206 compares the first monitor value PAV with the first target PAVT to generate a first comparison result.

Step 310: The first current generation module 208 executes a first corresponding operation on the bias current IB according to the first comparison result.

Step 312: The temporary modulation current generator 2110 of the second current generation module 210 generates a temporary modulation current IMT according to the modulation current IM.

Step 314: The driving unit 202 drives the laser diode 214 according to the bias current IB and the temporary modulation current IMT.

Step 316: The monitor unit 204 generates a second monitor value PMV corresponding to an average modulation power of the laser diode 214 when the laser diode 214 is driven by the bias current IB and the temporary modulation current IMT according to the light emitted by the laser diode 214.

Step 318: The second comparator 2064 of the comparison unit 206 compares the second monitor value PMV with the second target PMT to generate a second comparison result.

Step 320: The second current generation module 210 executes a second corresponding operation on the modulation current IM according to the second comparison result, go to Step 304.

As shown in FIGS. 2, 4, in Step 302, the user can first set an initial value (e.g. 3 mA) of the bias current IB, an initial value (e.g. 5 mA) of the modulation current IM, an initial value of the first target PAVT corresponding to the predetermined average power (e.g. 9 mW), and an initial value of the second target PMT corresponding to the predetermined average modulation power (e.g. 9.6 mW). As shown in FIGS. 2, 4, in Step 304, during a period T1, the driving unit 202 drives the laser diode 214 according to the bias current IB (e.g. 3 mA) and the modulation current IM (e.g. 5 mA). But, in another embodiment of the present invention, the driving unit 202 drives the laser diode 214 according to the bias current IB (e.g. 3 mA), the modulation current IM (e.g. 5 mA), and a first driving signal A0, wherein the first driving signal A0 is a burst mode driving signal. But, the present invention is not limited to the first driving signal A0 being a burst mode driving signal, that is, the first driving signal A0 can also be a continuous mode driving signal. In addition, as shown in FIG. 4, when the driving unit 202 drives the laser diode 214 according to the bias current IB (e.g. 3 mA) and the modulation current IM (e.g. 5 mA), the laser diode 214 can emit an output power P1 (e.g. 8 mW) and an output power P0 (e.g. 3 mW). As shown in FIGS. 2, 4, in Step 306, the monitor unit 204 can generate the first monitor value PAV (wherein the first monitor value PAV can be a current value or a voltage value) according to the light emitted by the laser diode 214, wherein the first monitor value PAV corresponds to the average power (e.g. 5.5 mW) of the laser diode 214 when the laser diode 214 is driven by the bias current IB and the modulation current IM. In Step 308, the first comparator 2062 of the comparison unit 206 compares the first monitor value PAV (corresponding to the average power (e.g. 5.5 mW)) with the first target PAVT (corresponding to power 9 mW) to generate the first comparison result (that is, the first monitor value PAV is less than the first target PAVT). In addition, as shown in FIG. 2, the second comparator 2064 of the comparison unit 206 can also compare the first monitor value PAV with the second target PMT in fact. But, because clocks CLKB, CLKB' are disabled, the second comparison result outputted by the second comparator 2064 is neglected. As shown in FIG. 4, in Step 310, when clocks CLKA, CLKA' are enabled and the clocks CLKB, CLKB' are disabled, the first comparison result generated by the first comparator 2062 can pass the first flip-flop 2082 and be filtered by the first digital filter 2084, wherein the first flip-flop 2082 is used for storing the first comparison result generated by the first comparator 2062. Because the first monitor value PAV is less than the first target PAVT, an output generated by the first digital filter 2084 can make the first counter 2086 count upward. Because the first counter 2086 counts upward, the first digital-to-analog converter 2088 increases the bias current IB (e.g. 3 mA) to generate a new bias current IB (e.g. 4 mA). In Step 312, when the first digital-to-analog converter 2088 generates the bias current IB (e.g. 4 mA), the switch 21106 of the temporary modulation current generator 2110 is turned on, so the temporary modulation current generator 2110 can utilize the multiplier 21102 and the adder 21104 to generate the temporary modulation current IMT according to the modulation current IM (e.g. 5 mA), wherein the temporary modulation current IMT is a sum of the modulation current IM (e.g. 5 mA) and a product of the modulation current IM (e.g. 5 mA) and a predetermined value (e.g. 0.2), that is, the temporary modulation current IMT is 5+0.2×5=6 mA.

As shown in FIGS. 2, 4, in Step 314, during a period T2, the driving unit 202 drives the laser diode 214 according to the bias current IB (e.g. 4 mA) and the temporary modulation current IMT (e.g. 6 mA). But, in another embodiment of the present invention, the driving unit 202 drives the laser diode 214 according to the bias current IB (e.g. 4 mA), the temporary modulation current IM (e.g. 6 mA), and a second driving signal B0, wherein the second driving signal B0 is a burst mode driving signal. But, the present invention is not limited to the second driving signal B0 being a burst mode driving signal, that is, the second driving signal B0 can also be a continuous mode driving signal. In addition, as shown in FIG. 4, when the driving unit 202 drives the laser diode 214 according to the bias current IB (e.g. 4 mA) and the temporary modulation current IMT (e.g. 6 mA), the laser diode 214 can emit the output power P1 (e.g. 10 mW) and the output power P0 (e.g. 4 mW). As shown in FIGS. 2, 4, in Step 316, the monitor unit 204 can generate the second monitor value PMV (wherein the second monitor value PMV can be a current value or a voltage value) according to the light emitted by the laser diode 214, wherein the second monitor value PMV corresponds to the average modulation power (e.g. 7 mW) of the laser diode 214 when the laser diode 214 is driven by the bias current IB (e.g. 4 mA) and the temporary modulation current IMT (e.g. 6 mA). In Step 318, the second comparator 2064 of the comparison unit 206 compares the second monitor value PMV (corresponding to the average modulation power (e.g. 7 mW)) with the second target PMT (corresponding to power 9.6 mW) to generate the second comparison result (that is, the second monitor value PMV is less than the second target PMT). As shown in FIG. 4, in Step 320, when the clocks CLKA, CLKA' are disabled and the clocks CLKB, CLKB' are enabled, the second comparison result generated by the second comparator 2064 can pass the second flip-flop 2102 and be filtered by the second digital filter 2104, wherein the second flip-flop 2102 is used for storing the second comparison result generated by the second comparator 2064. Because the second monitor value PMV is less than the second target PMT, an output generated by the second digital filter 2104 can make the second counter 2106 count upward. Because the second counter 2106 counts upward, the second digital-to-analog converter 2108 increases the modulation current IMT (e.g. 5 mA) to generate a new modulation current IM (e.g. 6 mA). In addition, after the second current generation module 210 generates the modulation current IM (e.g. 6 mA), because operational principles of the driving circuit 200 during a period T3, a period T4, and a period T5 are the same as those of the driving circuit 200 during the period T1 and the period T2, further description thereof is omitted for simplicity. Further, in another embodiment of the present invention, the period T3, the period T4, and the period T5 corresponds to a first driving signal A1, a second driving signal B1, and a first driving signal A2, respectively.

As shown in FIGS. 2, 4, after the period T5, during a period T6, in Step 314 and Step 316, when the driving unit 202 drives the laser diode 214 according to the bias current IB (e.g. 6 mA) and the temporary modulation current IMT (7+0.2× 7=8.4 mA), the monitor unit 204 can generate the second monitor value PMV according to the light emitted by the laser diode 214, wherein the second monitor value PMV corresponds to the average modulation power (e.g. 10.2 mW) of the laser diode 214 when the laser diode 214 is driven by the bias current IB (e.g. 6 mA) and the temporary modulation current IMT (e.g. 8.4 mA). In Step 318, the second comparator 2064 of the comparison unit 206 compares the second monitor value PMV (corresponding to the average modulation power (e.g. 10.2 mW)) with the second target (corresponding to power 9.6 mW) to generate the second comparison result (that is, the second monitor value PMV is greater than the second target PMT). As shown in FIG. 4, in Step 320, when the clocks CLKA, CLKA' are disabled and the clocks CLKB, CLKB' are enabled, the second comparison result generated by the second comparator 2064 can pass the second flip-flop 2102 and be filtered by the second digital filter 2104. Because the second monitor value PMV is greater than the second target PMT, the output generated by the second digital filter 2104 can make the second counter 2106 count downward. Because the second counter 2106 counts downward, the second digital-to-analog converter 2108 decreases the modulation current IMT (e.g. 7 mA) to generate a new modulation current IM (e.g. 6 mA).

As shown in FIGS. 2, 4, after the period T6, during a period T7, in Step 304 and Step 306, the driving unit 202 drives the laser diode 214 according to the bias current IB (e.g. 6 mA) and the modulation current IM (e.g. 6 mA), the monitor unit 204 can generate the first monitor value PAV according to the light emitted by the laser diode 214, wherein the first monitor value PAV corresponds to the average power (e.g. 9 mW) of the laser diode 214 when the laser diode 214 is driven by the bias current IB (e.g. 6 mA) and the modulation current IM (e.g. 6 mA). In Step 308, the first comparator 2062 of the comparison unit 206 compares the first monitor value PAV (corresponding to the average power (e.g. 9 mW)) with the first target PAVT (corresponding to power 9 mW) to generate the first comparison result (that is, the first monitor value PAV is equal to the first target PAVT). As shown in FIG. 4, in Step 310, when the clocks CLKA, CLKA' are enabled and the clocks CLKB, CLKB' are disabled, the first comparison result generated by the first comparator 2062 can pass the first flip-flop 2082 and be filtered by the first digital filter 2084. However, because the first monitor value PAV is equal to the first target PAVT, the output generated by the first digital filter 2084 can make the first counter 2086 maintain a current count. Because the first counter 2086 maintains the current count, the first digital-to-analog converter 2088 maintains to output the current bias current IB (e.g. 6 mA).

As shown in FIGS. 2, 4, after the period T7, during a period T8, in Step 314 and Step 316, when the driving unit 202 drives the laser diode 214 according to the bias current IB (e.g. 6 mA) and the temporary modulation current IMT (6+0.2× 6=7.2 mA), the monitor unit 204 can generate the second monitor value PMV according to the light emitted by the laser diode 214, wherein the second monitor value PMV corresponds to the average modulation power (e.g. 9.6 mW) of the laser diode 214 when the laser diode 214 is driven by the bias current IB (e.g. 6 mA) and the temporary modulation current IMT (e.g. 7.2 mA). In Step 318, the second comparator 2064 of the comparison unit 206 compares second monitor value PMV (corresponding to the average modulation power (e.g. 9.6 mW) with the second target PMT (corresponding to power 9.6 mW) to generate the second comparison result (that is, the second monitor value PMV is equal to the second target PMT). As shown in FIG. 4, in Step 320, when the clocks CLKA, CLKA' are disabled and the clocks CLKB, CLKB' are enabled, because the second monitor value PMV is equal to the second target PMT and the clocks CLKB, CLKB' are enabled, the second comparison result generated by the second comparator 2064 can pass the second flip-flop 2102 and be filtered by the second digital filter 2104. However, because the second monitor value PMV is equal to the second target PMT, the output generated by the second digital filter 2104 can make the second counter 2106 maintains a current count. Because the second counter 2106 maintains the current count, the second digital-to-analog converter 2108 maintains to output the current modulation current IM (e.g. 6 mA). In addition, after the second digital-to-analog converter 2108 maintains to output the current modulation current IM (e.g. 6 mA), because operational principles of the driving circuit 200 during a period T9 and a period T10 are the same as those of the driving circuit 200 during the period T7 and the period T8, further description thereof is omitted for simplicity. Further, in another embodiment of the present invention, the period T9 and the period T10 corresponds to a first driving signal A4 and a second driving signal B4, respectively.

Figure 5A:
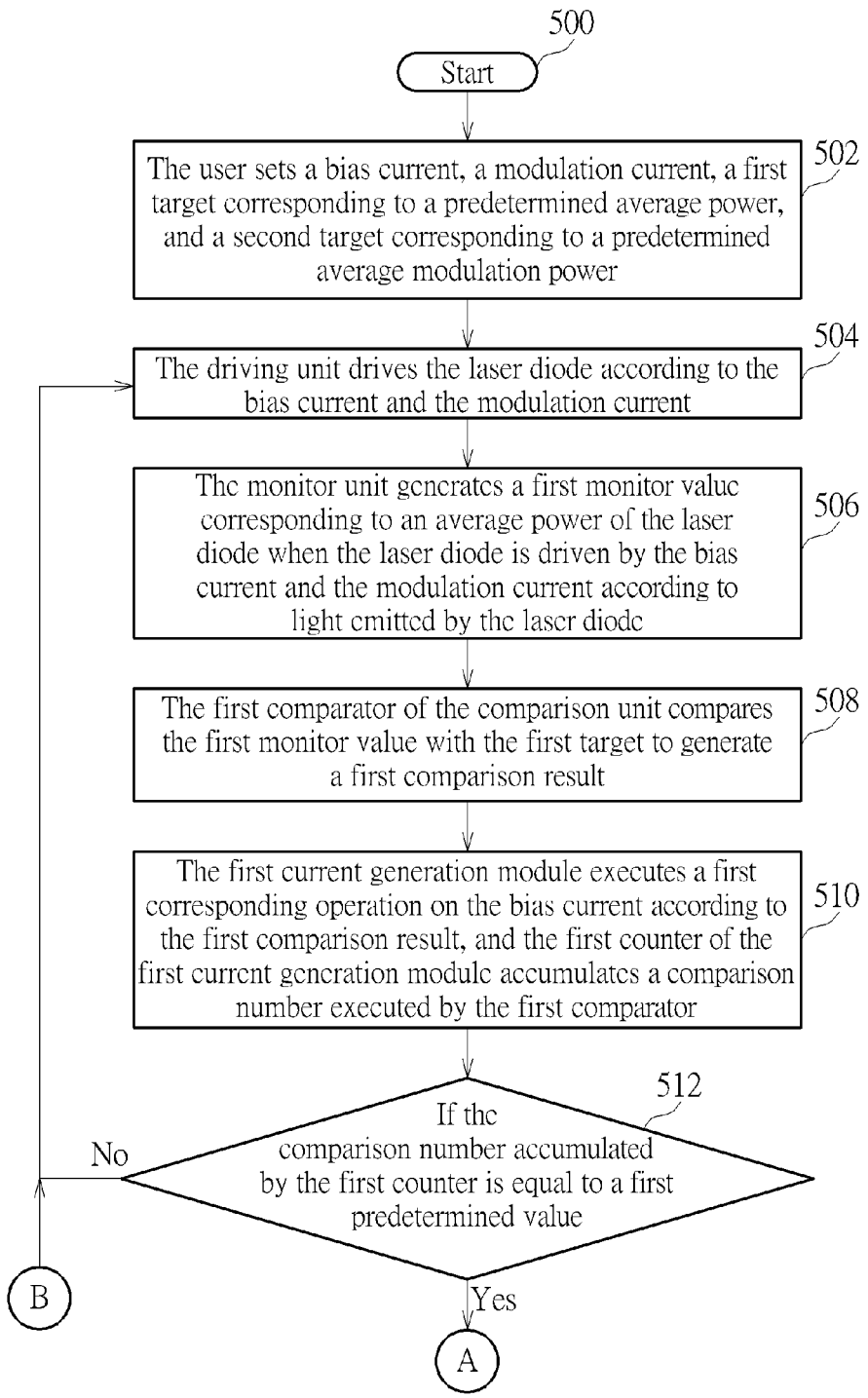
FIG. 5A and FIG. 5B are flowcharts illustrating a driving method of a laser diode according to a third embodiment.
Figure 5B:
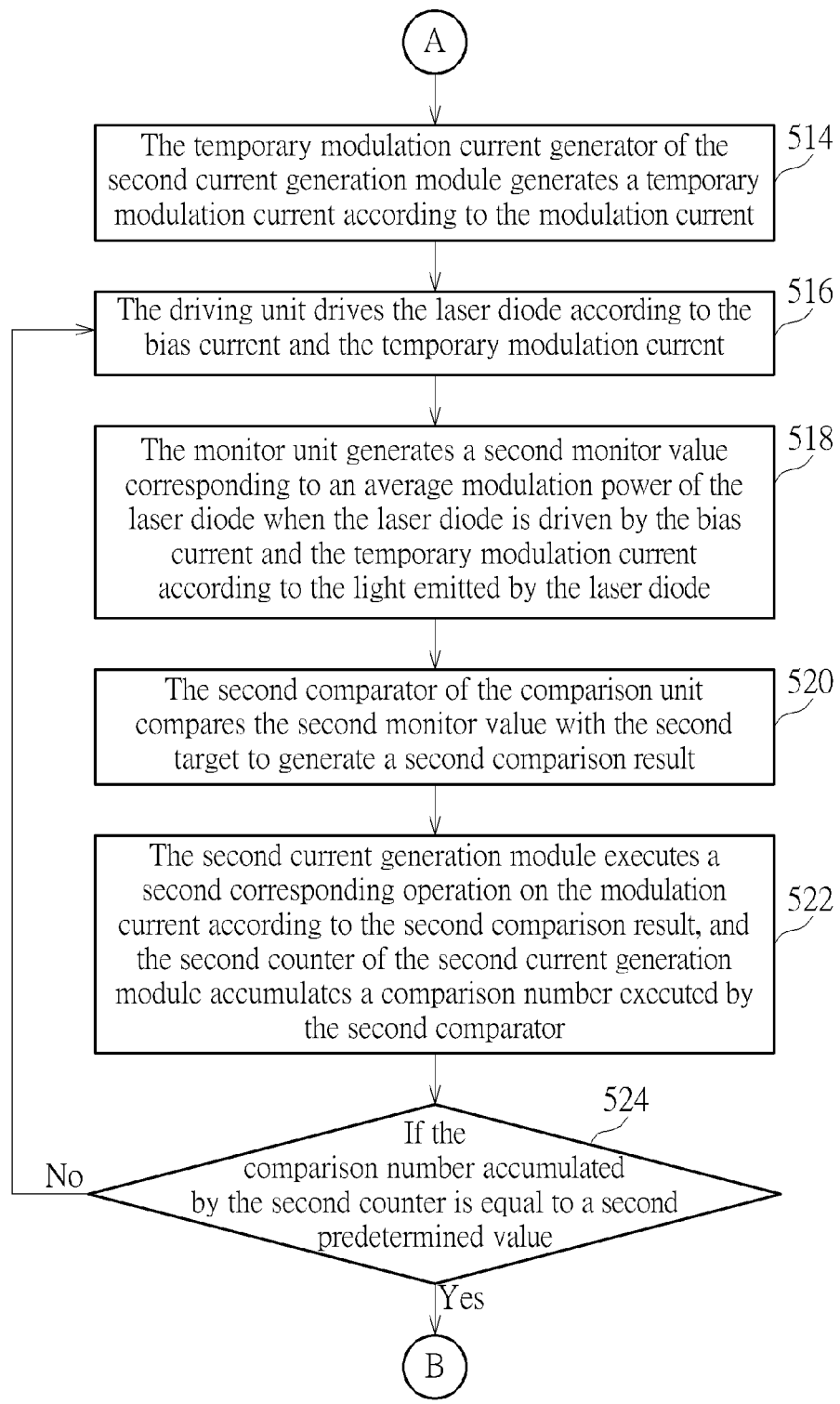
Figure 6:
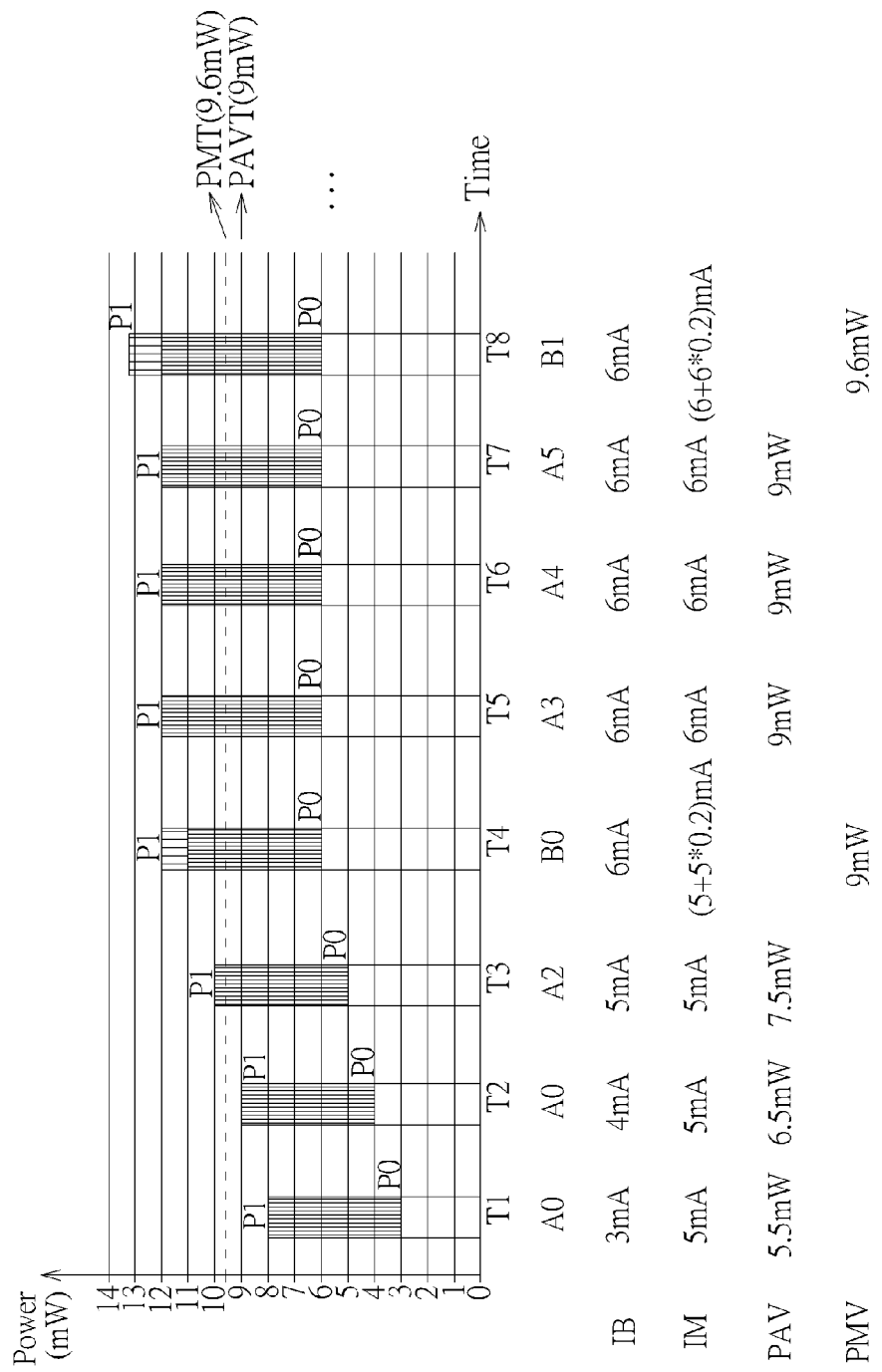
FIG. 6 is a diagram illustrating the bias current, the modulation current, the temporary modulation current, a first monitor value, a second monitor value, and the corresponding output powers.

Please refer to FIGS. 2, 5A, 5B, 6. FIG. 5A and FIG. 5B are flowcharts illustrating a driving method of a laser diode according to a third embodiment, and FIG. 6 is a diagram illustrating the bias current, the modulation current, the temporary modulation current, the average power, the modulation power, and the output powers. The method in FIG. 5A and FIG. 5B is illustrated using the driving circuit 200 in FIG. 2. Detailed steps are as follows:

Step 500: Start.

Step 502: The user sets a bias current IB, a modulation current IM, a first target PAVT corresponding to a predetermined average power, and a second target PMT corresponding to a predetermined average modulation power.

Step 504: The driving unit 202 drives the laser diode 214 according to the bias current IB and the modulation current IM.

Step 506: The monitor unit 204 generates a first monitor value PAV corresponding to an average power of the laser diode 214 when the laser diode 214 is driven by the bias current IB and the modulation current IM according to light emitted by the laser diode 214.

Step 508: The first comparator 2062 of the comparison unit 206 compares the first monitor value PAV with the first target PAVT to generate a first comparison result.

Step 510: The first current generation module 208 executes a first corresponding operation on the bias current IB according to the first comparison result, and the first counter 2086 of the first current generation module 208 accumulates a comparison number executed by the first comparator 2062.

Step 512: If the comparison number accumulated by the first counter 2086 is equal to a first predetermined value; if yes, go to Step 514; if no, go to Step 504.

Step 514: The temporary modulation current generator 2110 of the second current generation module 210 generates a temporary modulation current IMT according to the modulation current IM.

Step 516: The driving unit 202 drives the laser diode 214 according to the bias current IB and the temporary modulation current IMT.

Step 518: The monitor unit 204 generates a second monitor value PMV corresponding to an average modulation power of the laser diode 214 when the laser diode 214 is driven by the bias current IB and the temporary modulation current IMT according to the light emitted by the laser diode 214.

Step 520: The second comparator 2064 of the comparison unit 206 compares the second monitor value PMV with the second target PMT to generate a second comparison result.

Step 522: The second current generation module 210 executes a second corresponding operation on the modulation current IM according to the second comparison result, and the second counter 2106 of the second current generation module 210 accumulates a comparison number executed by the second comparator 2064.

Step 524: If the comparison number accumulated by the second counter 2106 is equal to a second predetermined value; if yes, go to Step 504; if no, go to Step 506.

A difference between the embodiment in FIG. 5A and FIG. 5B and the embodiment in FIG. 3A and FIG. 3B is that a second adjusting current step group (Step 516-524) is executed after a number of a first adjusting current step group (Step 504-512) being repeatedly executed is equal to the first predetermined value, and the first adjusting current step group (Step 504-512) is executed again after a number of the second adjusting current step group (Step 516-524) being repeatedly executed is equal to the second predetermined value, wherein the first predetermined value and the second predetermined value can be positive integers. In addition, as shown in FIG. 6, operational principles of the driving circuit 200 during periods T1-T8 are the same as those of the driving circuit 200 during the periods T1-T10 in FIG. 3A and FIG. 3B, so further description thereof is omitted for simplicity.

Figure 7:
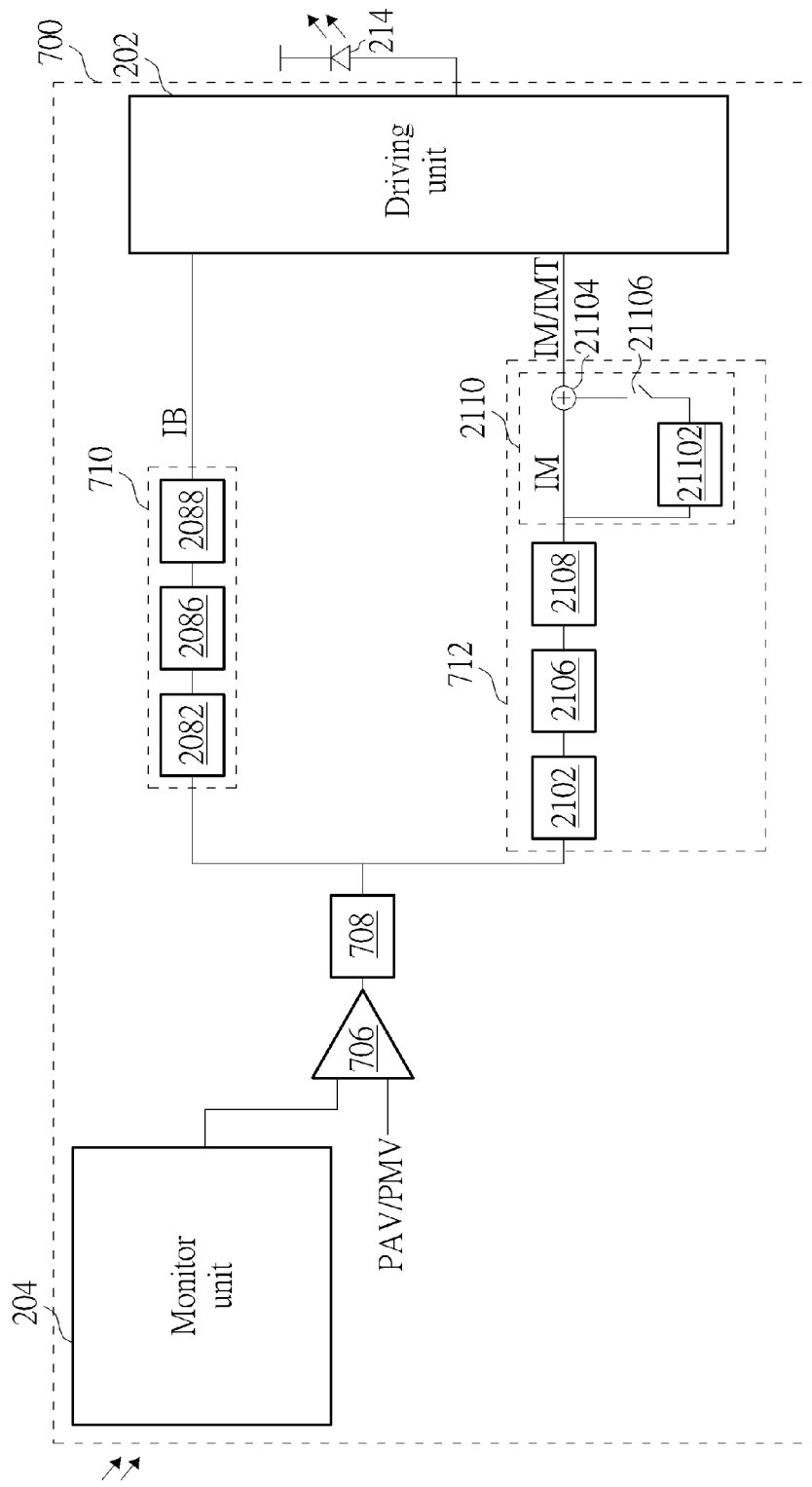
FIG. 7 is a diagram illustrating a driving circuit of a laser diode according to a fourth embodiment.

Please refer to FIG. 7. FIG. 7 is a diagram illustrating a driving circuit 700 of a laser diode according to a fourth embodiment. As shown in FIG. 7, differences between the driving circuit 700 and the driving circuit 200 are that the driving circuit 700 integrates the first comparator 2062 and the second comparator 2064 of the driving circuit 200 into a comparator 706, and integrates the first digital filter 2084 and the second digital filter 2104 of the driving circuit 200 into a filter 708; a first current generation module 710 includes a first flip-flop 2082, a first counter 2086, and a first digital-to-analog converter 2088; and a second current generation module 712 includes a second flip-flop 2102, a second counter 2106, a second digital-to-analog converter 2108, and a temporary modulation current generator 2110. In addition, operational principles of the driving circuit 700 are the same as those of the driving circuit 200, so further description thereof is omitted for simplicity.

To sum up, the driving circuit of a laser diode and the driving method of a laser diode utilize the first current generation module and the first target to adjust the bias current driving the laser diode, and utilize the second current generation module and the second target to adjust the modulation current driving the laser diode. Therefore, compared to the prior art, the present invention has advantages as follows: first, because the present invention has a feedback loop corresponding to the first current generation module adjusting the bias current and a feedback loop corresponding to the second current generation module adjusting the modulation current, the present invention does not need an additional memory; and second, because the present invention has the feedback loop corresponding to the first current generation module adjusting the bias current and the feedback loop corresponding to the second current generation module adjusting the modulation current, the present invention can make the laser diode maintain a fixed extinction ratio under different operation temperatures.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A driving method of a laser diode, the driving method comprising:
    setting a bias current, a modulation current, a first target corresponding to a predetermined average power, and a second target corresponding to a predetermined average modulation power;
    executing a first adjusting current step group, wherein the first adjusting current step group comprises:
        driving a laser diode according to the bias current and the modulation current;
        generating a first monitor value corresponding to an average power of the laser diode according to light emitted by the laser diode;
        comparing the first monitor value with the first target; and
        adjusting the bias current or maintaining the bias current according to a first comparison result;
    generating a temporary modulation current according to the modulation current;
    executing a second adjusting current step group, wherein the second adjusting current step group comprises:
        driving the laser diode according to the bias current and the temporary modulation current;
        generating a second monitor value corresponding to an average modulation power of the laser diode according to the light emitted by the laser diode;
        comparing the second monitor value with the second target; and
        adjusting the modulation current or maintaining the modulation current according to a second comparison result; and
    executing the first adjusting current step group again.

2. The driving method of claim 1, wherein when the first comparison result is the first monitor value greater than the first target, the bias current is decreased.

3. The driving method of claim 1, wherein when the first comparison result is the first monitor value less than the first target, the bias current is increased.

4. The driving method of claim 1, wherein when the first comparison result is the first monitor value equal to the first target, the bias current is maintained.

5. The driving method of claim 1, wherein when the second comparison result is the second monitor value greater than the second target, the modulation current is decreased.

6. The driving method of claim 1, wherein when the second comparison result is the second monitor value less than the second target, the modulation current is increased.

7. The driving method of claim 1, wherein when the second comparison result is the second monitor value equal to the second target, the modulation current is maintained.

8. The driving method of claim 1, further comprising:
    driving the laser diode according to the bias current, the modulation current, and a first driving signal.

9. The driving method of claim 8, wherein the first driving signal is a burst mode driving signal.

10. The driving method of claim 8, wherein the first driving signal is a continuous mode driving signal.

11. The driving method of claim 1, further comprising:
    driving the laser diode according to the bias current, the temporary modulation current, and a second driving signal.

12. The driving method of claim 11, wherein the second driving signal is a burst mode driving signal.

13. The driving method of claim 11, wherein the second driving signal is a continuous mode driving signal.

14. The driving method of claim 1, wherein the temporary modulation current is a sum of the modulation current and a product of the modulation current and a predetermined value.

15. A driving method of a laser diode, the driving method comprising:
    setting a bias current, a modulation current, a first target corresponding to a predetermined average power, and a second target corresponding to a predetermined average modulation power;
    repeatedly executing a first adjusting current step group a first predetermined times, wherein the first adjusting current step group comprises:
        driving a laser diode according to the bias current and the modulation current;
        generating a first monitor value corresponding to an average power of the laser diode according to light emitted by the laser diode;
        comparing the first monitor value with the first target; and
        adjusting the bias current or maintaining the bias current according to a first comparison result;
    generating a temporary modulation current according to the modulation current;

repeatedly executing a second adjusting current step group a second predetermined times, wherein the second adjusting current step group comprises:
  driving the laser diode according to the bias current and the temporary modulation current;
  generating a second monitor value corresponding to an average modulation power of the laser diode according to the light emitted by the laser diode;
  comparing the second monitor value with the second target; and
  adjusting the modulation current or maintaining the modulation current according to a second comparison result; and
executing the first adjusting current step group again the first predetermined times.

16. A driving circuit of a laser diode, the driving circuit comprising:
  a driving unit driving a laser diode according to a bias current, a modulation current, and a first driving signal, or according to the bias current, a temporary modulation current, and a second driving signal, or according to the bias current and the modulation current, or according to the bias current and the temporary modulation current;
  a monitor unit generating a first monitor value corresponding to an average power of the laser diode and a second monitor value corresponding to an average modulation power of the laser diode according to light emitted by the laser diode;
  a comparison unit comparing the first monitor value with a first target corresponding to a predetermined average power to generate a first comparison result, and comparing the second monitor value with a second target corresponding to a predetermined average modulation power to generate a second comparison result;
  a first current generation module executing a first corresponding operation on the bias current according to the first comparison result; and
  a second current generation module generating the temporary modulation current according to the modulation current, and executing a second corresponding operation on the modulation current according to the second comparison result.

17. The driving circuit of claim 16, wherein when the first comparison result is the first monitor value greater than the first target, the first current generation module decreases the bias current; when the first comparison result is the first monitor value less than the first target, the first current generation module increases the bias current; and when the first comparison result is the first monitor value equal to the first target, the first current generation module maintains the bias current.

18. The driving circuit of claim 16, wherein when the second comparison result is the second monitor value greater than the second target, the second current generation module decreases the modulation current; when the second comparison result is the second monitor value less than the second target, the second current generation module increases the modulation current; and when the second comparison result is the second monitor value equal to the second target, the second current generation module maintains the modulation current.

19. The driving circuit of claim 16, wherein the first driving signal and the second driving signal are burst mode driving signals.

20. The driving circuit of claim 16, wherein the first driving signal and the second driving signal are continuous mode driving signals.

21. The driving circuit of claim 16, wherein the temporary modulation current is a sum of the modulation current and a product of the modulation current and a predetermined value.

* * * * *